United States Patent [19]
Davis et al.

[11] Patent Number: 5,620,782
[45] Date of Patent: *Apr. 15, 1997

[54] METHOD OF FABRICATING A FLEX LAMINATE PACKAGE

[75] Inventors: Charles R. Davis; Thomas P. Duffy, both of Endicott; Steven L. Hanakovic, Vestal; Howard L. Heck, Endcott; John T. Kolias, Vestal; John S. Kresge, Binghamton, all of N.Y.; David N. Light, Friendsville, Pa.; Ajit K. Trivedi, Endicott, N.Y.

[73] Assignee: International Business Machines Corporation, Armonk, N.Y.

[ * ] Notice: The term of this patent shall not extend beyond the expiration date of Pat. No. 5,280,414.

[21] Appl. No.: 459,929

[22] Filed: Jun. 2, 1995

Related U.S. Application Data

[62] Division of Ser. No. 97,544, Jul. 27, 1993, Pat. No. 5,384,690.

[51] Int. Cl.$^6$ ........................................ B32B 9/00
[52] U.S. Cl. ..................... 428/209; 361/777; 361/778; 361/795; 428/901; 174/255; 174/256; 174/257; 174/258; 174/259; 29/860
[58] Field of Search .................... 361/795, 777, 361/778, 209; 428/901; 174/255, 256, 257, 258, 259; 29/860

*Primary Examiner*—Patrick Ryan
*Assistant Examiner*—C. Lee
*Attorney, Agent, or Firm*—Richard M. Goldman

[57] ABSTRACT

Disclosed is a parallel processor packaging structure and a method for manufacturing the structure. The individual logic and memory elements are on printed circuit cards. These printed circuit boards and cards are, in turn, mounted on or connected to circuitized flexible substrates extending outwardly from a laminate of the circuitized, flexible substrates. Intercommunication is provided through a switch structure that is implemented in the laminate. The printed circuit cards are mounted on or connected to a plurality of circuitized flexible substrates, with one printed circuit card at each end of the circuitized flexible circuit. The circuitized flexible substrates connect the separate printed circuit boards and cards through the central laminate portion. This laminate portion provides XY plane and Z-axis interconnection for inter-processor, inter-memory, inter-processor/memory element, and processor to memory bussing interconnection, and communication. The planar circuitization, as data lines, address lines, and control lines of a logic chip or a memory chip are on the individual printed circuit boards and cards, which are connected through the circuitized flex, and communicate with other layers of flex through Z-axis circuitization (vias and through holes) in the laminate. Lamination of the individual subassemblies is accomplished with a low melting adhesive that is chemical compatible with (bondable to) the per fluorocarbon polymer between the subassemblies in the regions intended to be laminated, and, optionally, a high melting mask that is chemically incompatible with (not bondable to) the per fluorocarbon polymer between the subassemblies in the regions not intended to be laminated. The subassembly stack is heated to selectively effect adhesion and lamination in areas thereof intended to be laminated while avoiding lamination in areas not intended to be laminated.

1 Claim, 5 Drawing Sheets

METHOD OF FABRICATING A FLEX LAMINATE PACKAGE

This is a divisional of application Ser. No. 08/097,544, filed Jul. 27, 1993, now U.S. Pat. No. 5,384,690.

CROSS REFERENCE TO RELATED APPLICATIONS

This application is related to the following co-pending, commonly assigned U.S. patent applications:

U.S. patent application Ser. No. 08/097,744, filed Jul. 27, 1993 by Raymond T. Galasco and Jayanal T. Molla for *Solder Bonded Parallel Processor Package Structure and Method of Solder Bonding* (Attorney Docket Number EN993035) now U.S. Pat. No. 5,432,988.

U.S. patent application Ser. No. 08/097,810 filed Jul. 27, 1993 by Thomas Gall and James Wilcox for *Method and Apparatus for Electrodeposition* (Attorney Docket Number EN993036) now U.S. Pat. No. 5,374,344.

U.S. patent application Ser. No. 98/098,085 filed Jul. 27, 1993 by Robert D. Edwards, Frank D. Egitto, Thomas P. Gall, Paul S. Gursky, David E. Houser, James S. Kamperman, and Warren R. Wrenner for *Method of Drilling Vias and Through Holes* (Attorney Docket Number EN993037) now U.S. Pat. No. 5,363,553.

U.S. patent application Ser. No. 08/097,606 filed Jul. 27, 1993 by John H. C. Lee, Ganesh Subbaryan, and Paul G. Wilkins for *Electromagnetic Bounce Back Braking for Punch Press and Punch Press Process* (Attorney Docket Number EN993038).

U.S. patent application Ser. No. 08/098,485 filed Jul. 27, 1993 by Thomas Gall, Howard Heck, and John Kresge for *Parallel Processor and Method of Fabrication* (Attorney Docket Number EN993039) now U.S. Pat. No. 5,347,710.

U.S. patent application Ser. No. 08/097,520 filed Jul. 27, 1993 by Thomas Gall and James Loomis for *Parallel Processor Structure and Package* (Attorney Docket Number EN993040) now U.S. Pat. No. 5,379,193.

U.S. patent application Ser. No. 08/097,605 filed Jul. 27, 1993 by Chi-Shi Chang and John P. Koons for *Parallel Processor Bus Structure and Package Incorporating The Bus Structure* (Attorney Docket Number EN993042).

U.S. patent application Ser. No. 08/096,603 filed Jul. 27, 1993 by Thomas Gall, James Loomis, David B. Stone, Cheryl L. Tytran, and James R. Wilcox for *Fabrication Tool and Method for Parallel Processor Structure and Package* (Attorney Docket Number EN993043) now U.S. Pat. No. 5,403,420.

U.S. patent application Ser. No. 08/097,601 filed Jul. 27, 1993 by John Andrejack, Natalie Feilchenfeld, David B. Stone, Paul Wilkin, and Michael Wozniak for *Flexible Strip Structure for a Parallel Processor and Method of Fabricating The Flexible Strip* (Attorney Docket Number EN993044).

U.S. patent application Ser. No. 08/097,604 filed Jul. 27, 1993 by Donald Lazzarini and Harold Kohn for *Method of Fabricating A Parallel Processor Package* (Attorney Docket Number EN993045) now U.S. Pat. No. 5,346,117.

FIELD OF THE INVENTION

The invention relates to packages for parallel processors, and more particularly to packages having a plurality of printed circuit cards and/or boards, e.g., dedicated printed circuit cards and/or boards, for carrying processors, memory, and processor/memory elements. The printed circuit cards and/or boards are mounted on and interconnected through a plurality of circuitized flexible cable substrates, i.e., flex strips. The circuitized flexible cable substrates, i.e., flex strips, connect the separate printed circuit boards and cards through a central laminate portion. This central laminate portion provides Z-axis, layer to layer means for inter-processor, inter-memory, inter-processor/memory element, and processor to memory bussing interconnection, and communication through vias and through holes extending from flex strip to flex strip through the laminate. More particularly this invention relates to the build of the laminate by the selective adhesion and lamination of the individual layers of the flexible cable.

BACKGROUND OF THE INVENTION

Parallel processors have a plurality of individual processors, all capable of cooperating on the same program. Parallel processors can be divided into Multiple Instruction Multiple Data (MIMD) and Single Instruction Multiple Data (SIMD) designs.

Multiple Instruction Multiple Data (MIMD) parallel processors have individual processing nodes characterized by fast microprocessors supported by many memory chips and a memory hierarchy. High performance inter node communications coprocessor chips provide the communications links to other microprocessors. Each processor node runs an operating system kernel, with communications at the application level being through a standardized library of message passing functions. In the MIMD parallel processor both shared and distributed memory models are supported.

Single Instruction Multiple Data (SIMD) parallel processors have a plurality of individual processor elements under the control of a single control unit and connected by an intercommunication unit. SIMD machines have an architecture that is specified by:

1. The number of processing elements in the machine.
2. The number of instructions that can be directly executed by the control unit. This includes both scalar instructions and program flow instructions.
3. The number of instructions broadcast by the control unit to all of the processor elements for parallel execution. This includes arithmetic, logic, data routing, masking, and local operations executed by each active processor element over data within the processor element.
4. The number of masking schemes, where each mask partitions the set of processor elements into enabled and disabled subsets.
5. The number of data routing functions, which specify the patterns to be set up in the interconnection network for inter-processor element communications.

SIMD processors have a large number of specialized support chips to support dozens to hundreds of fixed point data flows. Instructions come from outside the individual node, and distributed memory is supported.

Parallel processors require a complex and sophisticated intercommunication network for processor-processor and processor-memory communications. The topology of the interconnection network can be either static or dynamic. Static networks are formed of point-to-point direct connections which will not change during program execution. Dynamic networks are implemented with switched channels which can dynamically reconfigure to match the communications requirements of the programs running on the parallel processor.

Dynamic networks are particularly preferred for multipurpose and general purpose applications, Dynamic networks can implement communications patterns based on program demands. Dynamic networking is provided by one or more of bus systems, multistage intercommunications networks, and crossbar switch networks.

Critical to all parallel processors, and especially to dynamic networks is the packaging of the interconnection circuitry. Specifically, the packaging of the interconnection circuitry must provide high speed switching, with low signal attenuation, low crosstalk, and low noise.

SUMMARY OF THE INVENTION

The invention relates to parallel processors, and more particularly to parallel processors having a plurality of printed circuit cards and/or boards, e.g., dedicated printed circuit cards and/or boards, for carrying processors, memory, and processor/memory elements. The printed circuit cards and/or boards are mounted on a plurality of circuitized flexible substrates, i.e., flex strips. The circuitized flexible substrates connect the separate printed circuit boards and cards through a relatively rigid central laminate .portion. This central laminate portion provides means, e.g. Z-axis means, for inter-processor, inter-memory, inter-processor/ memory element, and processor to memory bussing interconnection, and communication.

Parallel processor systems have a plurality of individual processors, e.g., microprocessors, and a plurality of memory modules. The processors and the memory can be arrayed in one of several interconnection topologies, e.g., an SIMD (single instruction/multiple data) or an MIMD (multiple instruction/multiple data).

The memory modules and the microprocessors communicate through various topologies, as hypercubes, and toroidal networks, solely by way of exemplification and not limitation, among others. These inter-element communication topologies have various physical realizations. According to the invention described herein, the individual logic and memory elements are on printed circuit boards and cards. These printed circuit boards and cards are, in turn, mounted on or otherwise connected to circuitized flexible substrates extending outwardly from a relatively rigid, circuitized laminate of the individual circuitized flexible substrates. The intercommunication is provided through a switch structure that is implemented in the laminate. This switch structure, which connects each microprocessor to each and every other microprocessor in the parallel processor, and to each memory module in the parallel processor, has the physical structure shown in FIG. 1 and the logical/ electrical structure shown in FIG. 2.

More particularly, the preferred physical embodiment of this electrical and logical structure is a multilayer switch structure shown in FIG. 1. This switch structure provides separate layers of flex 21 for each unit or pairs of units, that is, each microprocessor, each memory module, or each microprocessor/memory element. The planar circuitization, as data lines, address lines, and control lines are on the individual printed circuit boards and cards 25, which are connected through the circuitized flex 21, and communicate with other layers of flex through Z-axis circuitization (vias and through holes) in the central laminate portion 21 in FIG. 1.

The bus structure is illustrated in FIG. 2, which shows a single bus, e.g., a data bus as the A Bus, the B Bus, or the O Bus, connecting a plurality of memory units through a bus, represented by OR-gates, to four processors. The Address Bus, Address Decoding Logic, and Read/Write Logic are not shown. The portion of the parallel processor represented by the OR gates, the inputs to the OR gates, and the outputs from the OR gates is carried by the laminated flex structure 41.

Structurally the parallel processor 11 has a plurality of integrated circuit chips 29, as processor chips 29a mounted on a plurality of printed circuit boards and cards 25. For example, the parallel processor structure 11 of our invention includes a first processor integrated circuit printed circuit board 25 having a first processor integrated circuit chip 29a mounted thereon and a second processor integrated circuit printed circuit board 25 having a second processor integrated circuit chip 29a mounted thereon.

Analogous structures exist for the memory integrated circuit chips 29b, the parallel processor 11 having a plurality of memory chips 29b mounted on a plurality of printed circuit boards and cards 25. In a structure that is similar to that for the processor chips, the parallel processor 11 of our invention includes a first memory integrated circuit printed circuit board 25 having a first memory integrated circuit chip 29b mounted thereon, and a second memory integrated circuit printed circuit board 25 having a second memory integrated circuit chip 29b mounted thereon.

Mechanical and electrical interconnection is provided between the integrated circuit chips 29 mounted on different printed circuit boards or cards 25 by a plurality of circuitized flexible strips 21. These circuitized flexible strips 21 each have a signal interconnection circuitization portion 211, a terminal portion 213 adapted for carrying a printed circuit board or card 25, and a flexible, circuitized portion 212 between the signal interconnection circuitization portion 211 and the terminal portion 213. The signal interconnection circuitization portion 211, has X-Y planar circuitization 214 and vias and through holes 215 for Z-axis circuitization.

The flexible circuitized strips 21 are laminated at their signal interconnection circuitization portion 211. This interconnection portion is built up as lamination of the individual circuitized flexible strips 21, and has X-axis, Y-axis, and Z-axis signal interconnection between the processor integrated circuit chips 29a and the memory integrated circuit chips 29b. In the resulting structure the circuitized flexible strips 21 are laminated in physical and electrical connection at their signal interconnection circuitization portions 211 and spaced apart at their terminal portions 213.

According to our invention the individual circuitized flexible strips 21 are discrete subassemblies. These subassemblies are themselves a laminate of at least one internal power core 221, at least one signal core 222, with a layer of dielectric 223 therebetween. The dielectric 223 is a polymeric dielectric having a dielectric constant less than 3.5, as a polyimide or a perfluorocarbon polymer, or, in a preferred exemplification, a multi-phase composite of a polymeric dielectric material having a low dielectric constant and having a low dielectric constant, low coefficient of thermal expansion material dispersed therethrough. Preferably the composite has a dielectric constant less than 3.5, and preferably below about 3.0, and in a particularly preferred embodiment below about 2.0. This is achieved by the use of a low dielectric constant pefluorocarbon polymer matrix, filled with a low coefficient of thermal expansion and preferably low dielectric constant filler. The perfluorocarbon polymer is chosen from the group consisting of perfluoroethylene, perfluoroalkoxies, and copolymers thereof. The dispersed low dielectric constant material is a low dielectric constant, low coefficient of thermal expansion, particulate filler. Exemplary low dielectric constant particulate filler are chosen from the group consisting of silica particles, silica spheres, hollow silica spheres, aluminum oxide, aluminum nitride, zirconium oxide, titanium oxide, and the like.

The power core 221 may be a copper foil, a molybdenum foil, or a "CIC" (Copper-Invar-Copper) laminate foil. The circuitized flexible strip 21 may be a 1S1P (one signal plane, one power plane) circuitized flexible strip, a 2S1P (two signal planes, one power plane) circuitized flexible strip or a 2S3P (two signal planes, three power planes) circuitized flexible strip.

The circuitized flexible strip 21 can have either two terminal portions 213 for carrying printed circuit boards 25 at opposite ends thereof, or a single terminal portion 213 for carrying a printed circuit board 25 at only one end of the circuitized flexible cable 21. Where the circuitized flexible strip 21 is adapted to carry a printed circuit board 25 at only one end, a pair of circuitized flexible strips 21, each having a terminal portion 213 at only one end can be laminated so that their signal interconnection circuitization portions 211 overlap but their terminal portions 213 and their flexible, circuitized 212 portions extend outwardly from opposite sides of the signal interconnection circuitization laminated body portion 41 of the parallel processor package 11.

In one preferred embodiment of the invention the via and signal trace densities are hierarchical in the laminated signal interconnection portion 41. That is, the via grids are progressively coarser (lower circuitization density) within the signal interconnection portion 41, going from the external traces on the top and bottom circuitized panels to the internal traces on internal circuitized panels. That is, moving away from the integrated circuit chips the wiring density becomes progressively less dense, i.e., coarser. In this embodiment of our invention the parallel processor package 11 has narrow and wide signal lines, with narrow signal lines for high circuit density at short interconnection distances, and wide signal lines for lower losses at long interconnection distances. It is, of course, to be understood that in a preferred embodiment of our invention the impedances are matched within the structure 11 to provide high performance.

According to a preferred embodiment of our invention the connection between the printed circuit boards and cards 25 and the terminal portions 213 of the circuitized flexible strip 21 is provided by dendritic Pd.

According to a still further embodiment of our invention the solder alloy means for pad to pad Joining of the circuitized flexible strips 21 at the signal interconnection circuitization portions 211 thereof is an alloy composition having a final melting temperature, when homogenized, above the primary thermal transition temperature of the dielectric material and having a system eutectic temperature below the primary thermal transition temperature of the dielectric. This can be a series of Au and Sn layers having a composition that is gold rich with respect to the system eutectic, said alloy having a system eutectic temperature of about 280 degrees Centigrade, and a homogeneous alloy melting temperature above about 400 degrees Centigrade, and preferably above about 500 degrees Centigrade.

The method of our invention further includes a method of forming the parallel processor structure by selectively defining and controlling the adhesion between the flex layers 21 within and beyond the laminate structure 41. This can be done by providing a low melting temperature adhesive compatible with the perfluorocarbon polymer between the subassemblies 21 in the regions intended to be laminated 211, and stacking a first subassembly 21 above a second subassembly 21 and heating the subassembly stack to effect adhesion and lamination.

In this embodiment of our invention the low melting temperature adhesive compatible with the perfluorocarbon polymer is preferably another perfluorocarbon, for example, a perfluoroalkoxy (PFA) polymer having a lower primary thermal transition temperature then the bulk perfluorocarbon. Additional adhesives include thermoplastic polyimide, such as those chosen from the group consisting of Pyralin 2525 BTDA-ODA-MPD, BPDA-6FDAM, and Pyralin 2566 6FDA-ODA.

In a still further embodiment of our invention a high melting temperature polymer, e.g, a perfluorocarbon polymer or a polyimide mask, that when fully cured is chemically incompatible (substantially chemically non reactive and non adhesive) with the bulk polymer can be placed between the subassemblies 21 in the regions not intended to be laminated 212, 213. This is followed by stacking a first subassembly 21 above a second subassembly 21 and heating the subassembly stack to selectively effect adhesion and lamination in the areas intended to be laminated 211 while avoiding lamination in areas not intended to be laminated 213.

The preferred polymeric mask can be a polyimide, such as BPDA-PDA. The polyimide is processed as a polyamic acid, which can be drawn down onto surfaces of the dielectric not intended to be laminated, and cured to the corresponding polyimide, or alternatively, the BPDA-PDA can be applied as a free standing film through lamination to the polymeric dielectric 21. Lamination can be above the melting temperature of the dielectric but below the imidization temperature of the polyamic acid, followed by cure to the corresponding polyimide.

According to a still further embodiment of our invention we provide a low melting adhesive that is chemically compatible (i.e., bondable) with the perfluorocarbon polymer between the subassemblies in the regions intended to be laminated, and a high melting mask that is not chemically compatible (i.e., not bondable) with the perfluorocarbon polymer between the subassemblies in the regions not intended to be laminated. We then stack a first subassembly above a second subassembly and heat the subassembly stack to selectively effect adhesion and lamination in areas thereof intended to be laminated while avoiding lamination in areas not intended to be laminated.

THE FIGURES

The invention may be understood by reference to the Figures appended hereto.

DETAILED DESCRIPTION OF THE INVENTION

Figure 1:
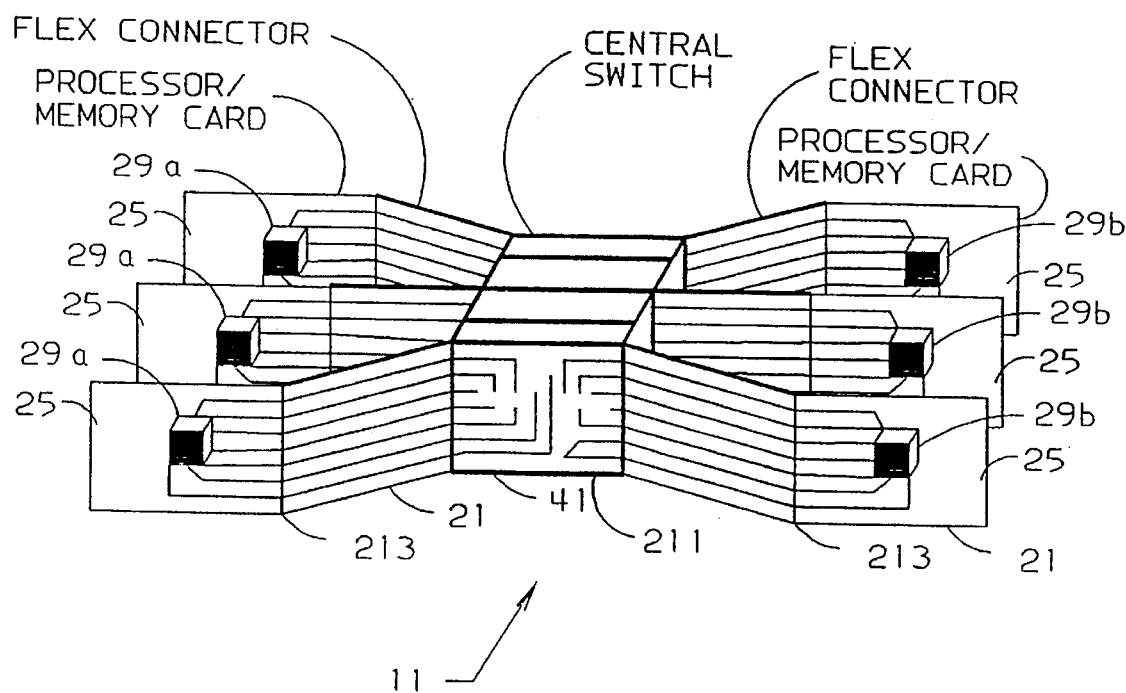
FIG. 1 shows an overview of the mechanical and structural features of the parallel processor package of the invention.

The invention described herein relates to a parallel processor 1 and a parallel processor package 11 having a plurality of integrated circuit chips 29, e.g., microprocessors 29a, preferably advanced microprocessors, and memory modules 29b, mounted on printed circuit cards and boards 25, and connected through a laminate 41 of circuitized flexible strips 21 as will be described herein below. The structure and methods of fabricating the structure and similar structures are useful in parallel processors, in bank switched memory with memory banks or fractional memory banks on an individual flex connector, and for providing flex cable to flex cable connection in a heavily interconnected network.

Advanced microprocessors, such as pipelined microprocessors and RISC (reduced instruction set computer) microprocessors provide dramatic increases in chip level integration and chip level circuit densities. These advanced microprocessors, in turn, place increasing demands on wiring densities and interconnections at the next lower levels of packaging. Moreover, when advanced microprocessors are combined into multi-processor configurations, i.e., parallel processors, as SIMD and MIMD parallel processors, still higher levels of performance, circuit density, including logic density and memory density, and I/O packaging, are all required.

Figure 2:
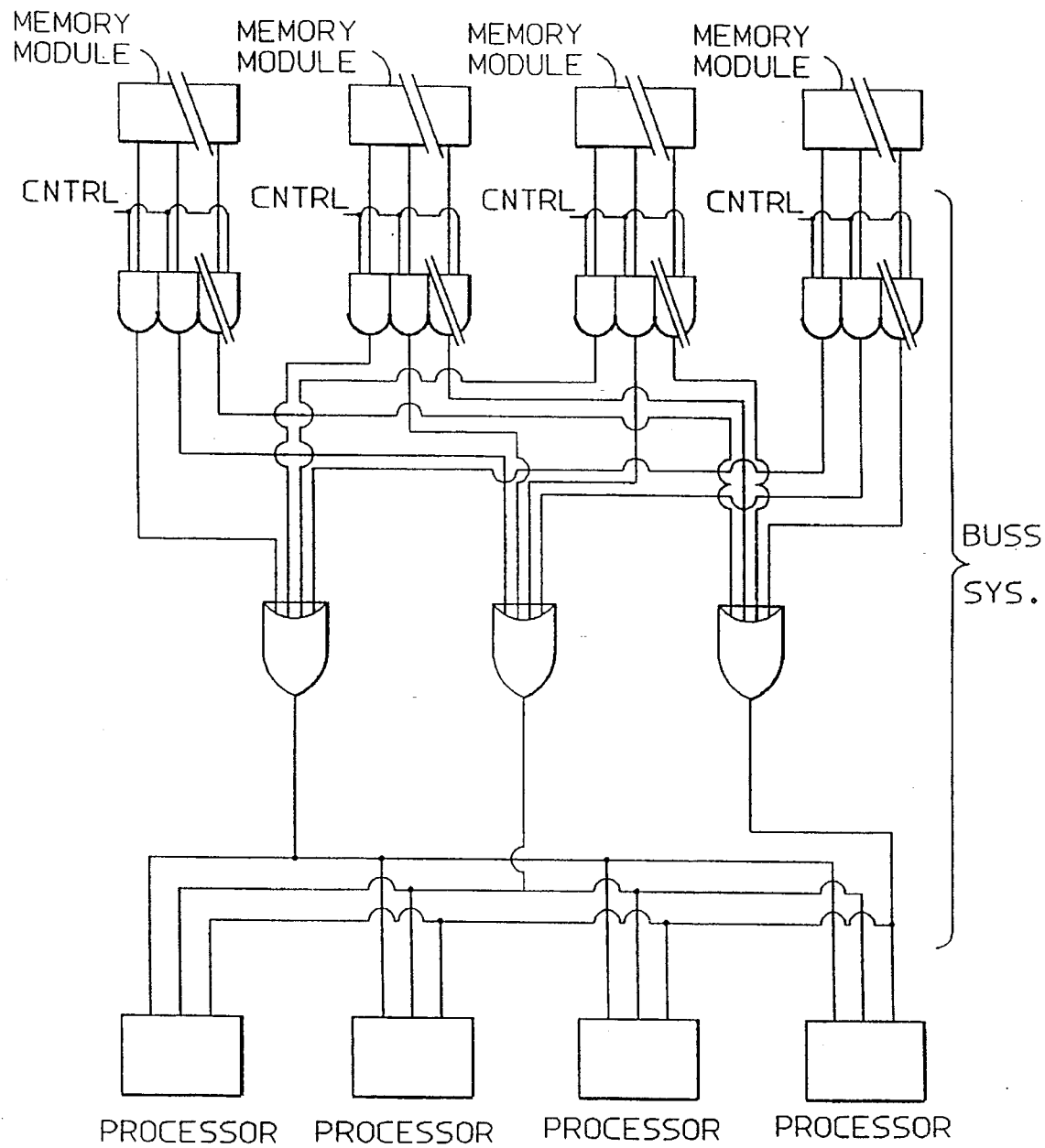
FIG. 2 shows a generalized and simplified schematic of one bus of bus structures that can be implemented in the package of the invention.
Figure 3:
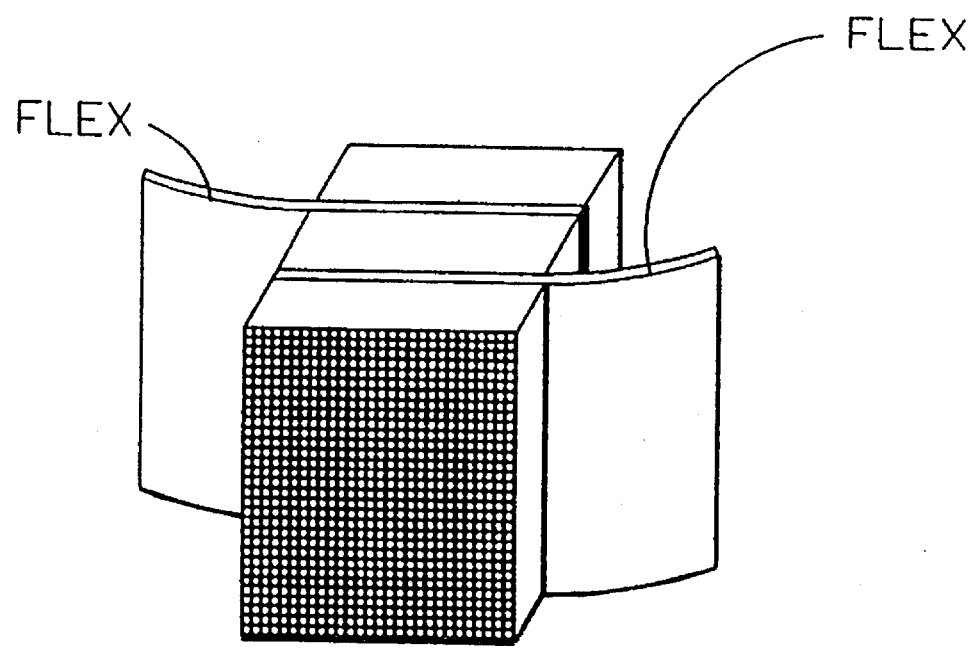
FIG. 3 shows an embodiment of the invention where the flex cables are offset from one another.

The basic parallel processor structure 11 of the invention, e.g., an SIMD or an MIMD parallel processor, builds from a plurality of microprocessors 29a and a plurality of memory modules 29b, with the memory modules 29b and the microprocessors 29a communicating through a laminate switch structure 11. This switch, which connects each microprocessor 29a to each and every other microprocessor 29a in the parallel processor 1, and to each memory module 29b in the parallel processor 1, has the logical/electrical structure shown in FIG. 2.

Laminate Switch Structure

Figure 5:
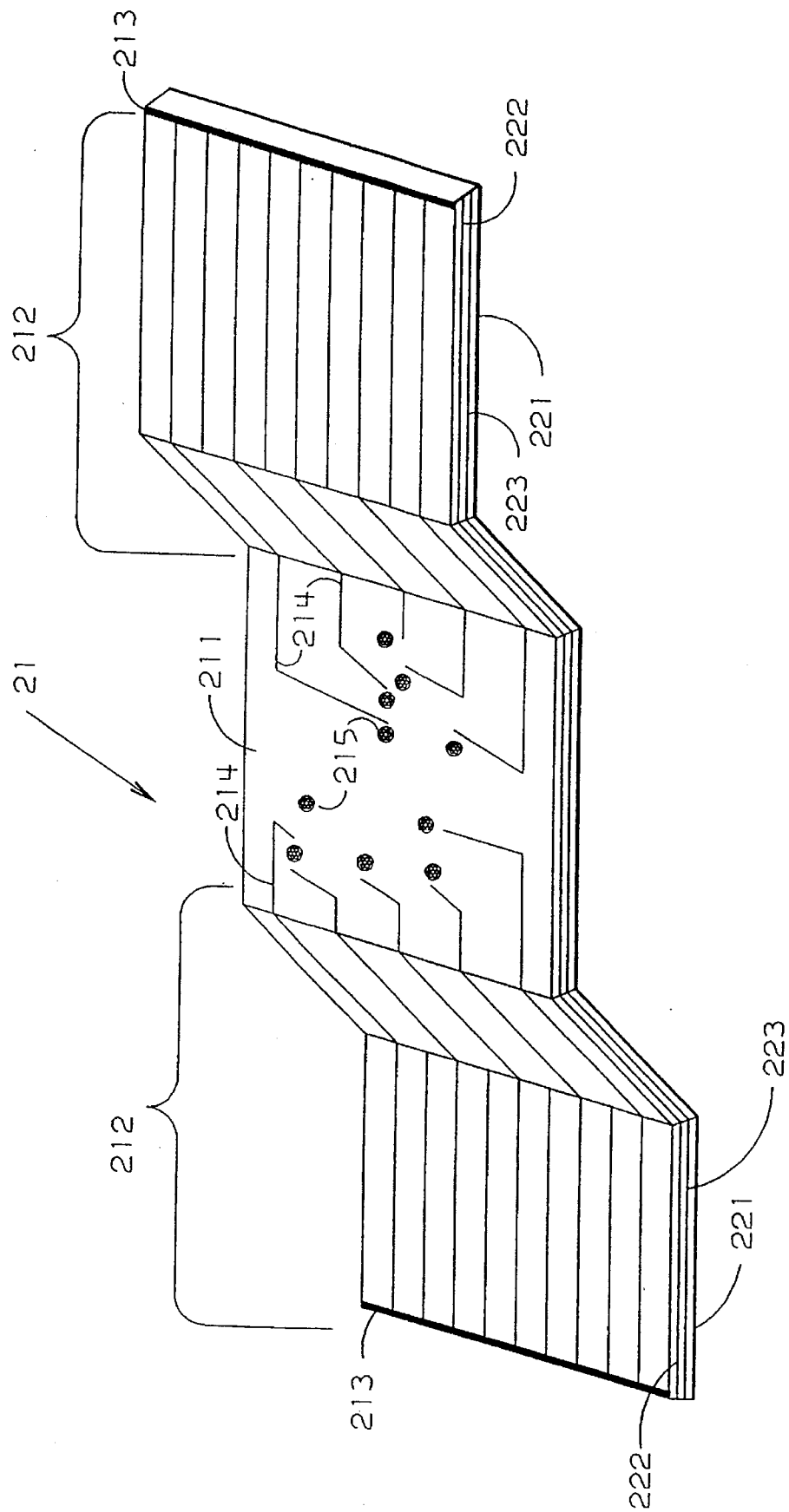
FIG. 5 shows a perspective view of a circuitized flexible strip of the invention having surface circuitization, Pd dendrites for connecting the printed circuit boards or cards

The parallel processor package 11 of the invention integrates carrier, connector, and I/O into a single package, with multiple circuitized flexible cables 21 that are built into a carrier cross section 41 using discrete subassemblies 21 which are laminated together to form a Z-axis signal and power connection laminate 41 between the discrete subassemblies 21. A discrete subassembly is shown generally in FIG. 5.

The physical embodiment of the package 11 yields high performance by utilizing high wirability printed circuit board technology that enhances present printed circuit card and board technology for massively parallel processor systems, while providing cost and performances advantages. Both the laminate 41, which we refer to as a central, switch, or rigid portion, and the outwardly extending flex portions 21 (intended for attachment to printed circuit boards or cards 25 carrying the memory modules 29b and the logic modules 29a) are characterized by printed circuit board like cross sections, and a low dielectric constant polymer substrate.

The physical embodiment of this electrical and logical structure encompasses the multilayer laminate switch structure shown in FIG. 1. This switch structure provides a separate layer of flex 21 for each printed circuit board or card 25 or each pair thereof. Each individual printed circuit board or card 25 can carry a microprocessor 29a, a memory module 29b, I/O, or a microprocessor/memory element. The planar circuitization 214, as data lines, address lines, and control lines is on the flex 21, and communicates with other layers of flex 21 through vias and through holes 217 in the laminate central portion 41, shown in FIG. 5.

This laminate flex design provides a large number of I/O's, for example twenty five thousand or more, from the package 11 while eliminating the need for the manufacture, alignment, and bonding of discrete flex cables extending outwardly from a single panel. A conventional planar panel would have to be many times larger to have room for the same connectivity as the integrated flex/rigid/flex or rigid/flex of the invention.

Flex Card Carriers Joined at a Central Laminate Switch Portion

The package 1 of the invention combines a laminate central or switch portion 41 and circuitized flexible strip extensions 21 extending outwardly therefrom and carrying terminal printed circuit boards and cards 25 for circuit elements 29a and 29b, as integrated circuit chips 29, thereon.

Heretofore flex cables and flex carriers have been integrated onto one or two surfaces, i.e., the top surface or the top and bottom surfaces, of a carrier. However, according to the present invention the flex cables 21 are integrated into a central switch or carrier structure 41 as a laminate with a plurality of stacked, circuitized flex strips 21. The area selective lamination of the flex carriers 21 in the central region 211 forms the rigid laminate carrier 41. This laminate region 41 carries the Z-axis circuitization lines from flex 21 to flex 21.

The individual plies of flex 21 have internal conductors, i.e., internal power planes 221 and internal signal planes 222. Additionally, in order to accommodate the narrow dimensional tolerances associated with the high I/O density, high wiring density, and high circuit density, it is necessary to carefully control the Coefficient of Thermal Expansion (CTE) of the individual subassemblies. This is accomplished through the use of an internal metallic conductor 221 of matched coefficient of thermal expansion (CTE), such a molybdenum foil or a Cu/Invar/Cu foil, to which the layers of dielectric 223 are laminated.

The combination of circuitized flex 21 extending outwardly from a central laminate section 41, with vias 215 and through holes 215 electrically connecting separate plies 21 of circuitized flex therethrough, reduces the footprint associated with the chip carrier, as wiring escape is easier.

This structure offers many advantages for a parallel processor, especially a massively parallel processor, as well as any other heavily interconnected system. Among other advantages, a reduced size chip carrier is possible, as escape is made easier, signal transmission lengths are reduced, and discontinuities due to contact mating between chip carrier and flex are reduced and reliability is enhanced as the chip carrier and the flex are a single entity.

The design of the parallel processor package calls for all vertical (Z-axis) connections to be made by bonding a joining alloy, e.g., transient liquid phase bonding Au/Sn, and the organic dielectric, as a perfluoropolymer, into a laminate of circuit panels, while the outwardly extending edges 212 and 213 of the panels 21 are not bonded, so that they can act as circuitized flex cables. This flexibility or bendability allows the printed circuit boards and cards 25 to be offset from one another remote from the laminate 41.

Specialized Cards and Boards

The parallel processor package of our invention allows a variety of component types to be mounted on the flexible elements. Specifically, the printed circuit card and board terminated circuitized flex strips are analogous to printed circuit boards and cards mounted in expansion slots in a conventional planar motherboard. The cards and boards at the ends of the circuitized flex strips can include Tape Automated Bonding (TAB) components, e.g., high I/O, fine lead pitch TAB.

Alternatively, surface mount circuitization can be utilized, for example, fine pitch plastic and ceramic surface mount packages.

Alternatively, high I/O area array solder ball connection techniques may be used. One such high I/O area array solder ball connected chip is shown mounted on a card that is, in turn, mounted on a flexible cable.

According to still further embodiment of the invention chip on board bonding and interconnection may be used.

Hierarchal Circuitization

The parallel processor package structure that is the subject of our invention mixes via and signal trace densities in a hierarchical fashion. That is, via grids become progressively coarser as we move deeper into the printed circuit structure, away from the surface and the components.

Signal features change within the structure to provide narrow lines for high circuit density at short interconnection distances, and wider lines, for lower losses, at longer interconnection distances. Impedances are matched within the structure to provide high performance.

Detailed Structural Design and Fabrication

According to a preferred embodiment of our invention, the central switch portion, i.e., the laminate portion, and the flex strips, used as card carriers in a manner analogous to expansion slots, are a single structural entity. This is achieved by selectively defining and controlling the adhesion between the layers of the structure. The layers can be either (1) discrete 2S3P (2 signal plane, 3 power plane) structures, substantially as shown in FIG. 6, or (2) combinations of discrete 2S3P (2 Signal plane, 3 power plane) and 2S1P (2 signal plane, 1 power plane) structures.

Figure 4:
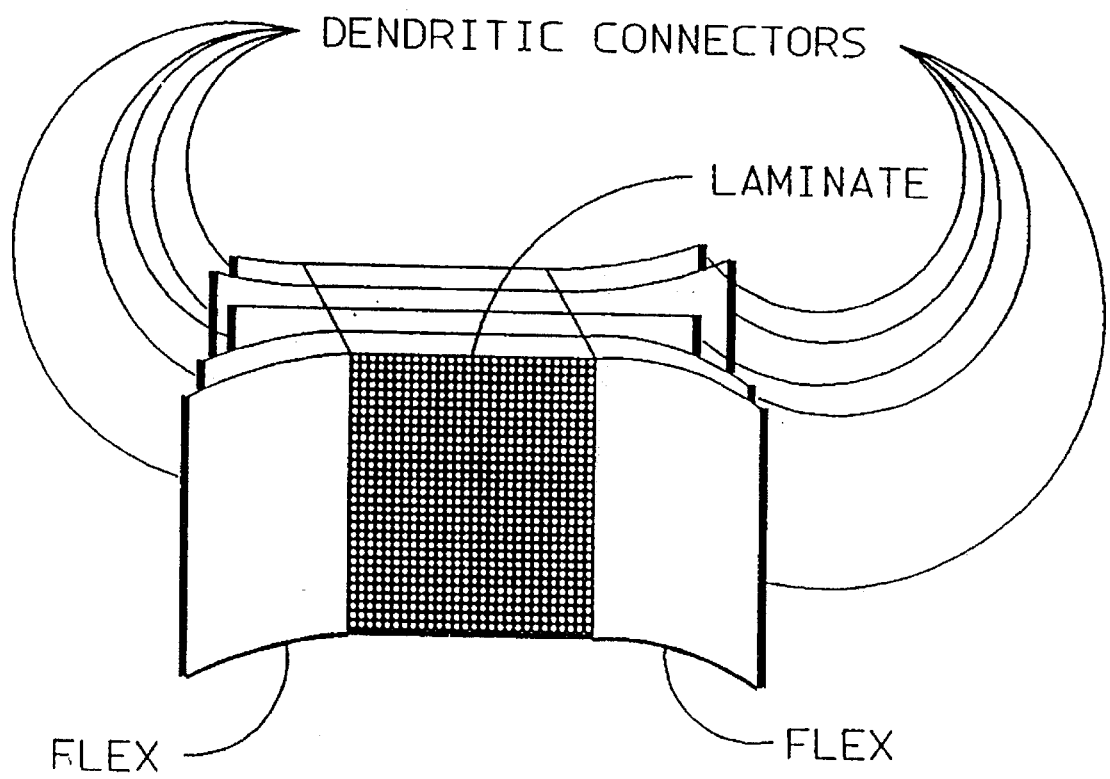
FIG. 4 shows the lamination of circuitized flexible strips to form a laminate with free portions.

The areas of the panel treated to achieve adhesion are laminated together to form the laminate 41, as shown in FIG. 4. Regions where there is no adhesion remain as flexible strips 21. Cards, either removable or soldered, for carrying microprocessor chips and/or memory chips, are carried by these outward extending segments of flex.

According to one method of the invention, a low coefficient of thermal expansion (CTE) tri-metallic foil as Copper/Invar/Copper (CIC) 221 is laminated between perfluorocarbon polymer sheets 222. The resulting laminate is than circuitized 223 to form a circuitized flex strip 21. More specifically, a solid, 1 mil, Cr sputtered, Cu/Invar/Cu panel, 14.5×10.0 inches, is sandwiched between 2 sheets of Rogers 2800 PFA dielectric sheet material or similar dielectric sheet material. Lamination is carried out at a high temperature, e.g., about 390 degrees C., and a high pressure, e.g., 1700 psi, for 30 minutes, in a non-reactive atmosphere, e.g., $N_2$. Metal layers, foils, and films may be laminated to the substrate to manage electromagnetic fields and provide electromagnetic shielding between layers. Additional dielectric sheets may be laminated to one or both sides of the structure, for example, after circuitization.

Subsequently, the subassemblies are laminated together, generally at a lower pressure, but otherwise substantially under the conditions described above. This is because core lamination, carried out at relatively high pressures, for example, above about 300 psi, densifies the dielectric, while laminations carried out at below about 300 psi do not densify the dielectric. The multilayer lamination is defined so that controlled and selective adhesion is achieved. This can be accomplished preferably by selection of adhesives, and alternatively by masking. That is, those portions that are not to be laminated together, i.e., that are to remain as outwardly extending flex, are either masked or coated with a high melting temperature perfluoroalkoxy to selectively control adhesion.

Lamination

The parallel processor switch package 11 of the invention requires critical lamination. Thus, according to our invention controlled and defined adhesion of mating surfaces 211 of the perfluorocarbon flex strips 21 is attained. Perfluorocarbon materials, especially perfluoroalkoxies, provide excellent lamination when processed above their melting temperature. However, below their melting temperature, only negligible adhesion occurs. According to one method of the invention, excellent lamination and selective adhesion is obtained at temperatures below the melting point of the perfluoroalklyl. This is accomplished through the use of thermoplastic polyimide films between the areas 211 of the flex strips 21 to be bonded. The preferred polyimides have a low dielectric constant, $\epsilon$, and a high thermal stability at temperatures encountered in joining processes (e.g., transient liquid phase bonding and $C^4$ controlled collapse chip connection). In this embodiment of the invention the areas of the subassemblies intended to be laminated 211 are coated with adhesives, e.g., low melting point adhesive, characterized by a primary thermal transition temperature below that of the bulk dielectric. Exemplary polyimides include Pyralin 2525 (BTDA-ODA-MPD); BPDA-6FDAM, and Pyralin 2566 6FDA-ODA, among others.

In this embodiment of our invention the low melting temperature adhesive compatible with the perfluorocarbon polymer bulk dielectric is preferably another perfluorocarbon, for example, a perfluoroalkoxy (PFA) polymer having a lower primary thermal transition temperature then the bulk perfluorocarbon. Additional adhesives having chemical compatibility (bondability) with the perfluorocarbon dielectric 21 include thermoplastic polyimide, such as those chosen from the group consisting of Pyralin 2525 BTDA-ODA-MPD, BPDA-6FDAM, and Pyralin 2566 6FDA-ODA.

In a still further embodiment of our invention a high melting temperature polymer, e.g, a perfluorocarbon polymer or a polyimide mask, that when fully cured is chemically incompatible (substantially chemically non reactive and non adhesive) with the bulk polymer can be placed between the subassemblies 21 in the regions not intended to be laminated 212, 213. This is followed by stacking a first subassembly 21 above a second subassembly 21 and heating the subassembly stack to selectively effect adhesion and lamination in the areas intended to be laminated 211 while avoiding lamination in areas not intended to be laminated 213.

The preferred polymeric mask can be a polyimide, such as BPDA-PDA. The polyimide is processed as a polyamic acid, which can be drawn down onto surfaces of the dielectric not intended to be laminated, and cured to the corresponding polyimide, or alternatively, the BPDA-PDA can be applied as a free standing film through lamination to the polymeric dielectric 21. This embodiment of the invention utilizes different polyimides, such as BPDA-PDA, as a mask to prevent bonding of PTFE to PTFE intended not to be bonded, 212 and 213. BPDA-PDA polyamic acid is coated onto the subassemblies to demarcate areas 212, 213 of the subassemblies 21 where lamination and adhesion are not desired. The coating is carried out by either draw-down coating methods or by controlled solvent removal. The preferred thickness of the BPDA-PDA is about 10 to 15 microns. The coating acts as a physical barrier/insulator, preventing the PTFE or other PFA from making adhesive contact.

When the BPDA-PDA is applied by draw-down bar methods, uniform coverage of the dielectric is achieved, and the BPDA-PDA polyamic acid can be cured to the corresponding polyimide.

When the BPDA-PDA is applied as a free standing film, the film lamination is carried out above the melting temperature of the polymer but below the imidization temperature of the film.

Lamination can be above the melting temperature of the dielectric but below the imidization temperature of the polyamic acid, followed by cure to the corresponding polyimide.

After separation and following imidization, the individual subassemblies 21 are stacked and laminated as described herein above, i.e., at a temperature of at least about 360 degree C. and at a pressure of at least about 330 psi for about 30 minutes. Following lamination the release of BPDA-PDA derived polyimide coated areas is easily achieved, while other areas, not coated with the BPDA-PDA derived polyimide are dielectric-dielectric bonded.

According to a still further embodiment of our invention, we provide a low melting adhesive that is chemically compatible (i.e., bondable) with the perfluorocarbon polymer between the subassemblies in the regions intended to be laminated, and a high melting mask that is not chemically compatible (i.e., not bondable) with the perfluorocarbon polymer between the subassemblies in the regions not intended to be laminated. We then stack a first subassembly above a second subassembly and heat the subassembly stack to selectively effect adhesion and lamination in areas thereof intended to be laminated while avoiding lamination in areas not intended to be laminated.

Transient Liquid Phase Bonding

In the fabrication of the laminate, lamination is a parallel process. That is, the individual polymeric dielectric panels, e.g., flex panels 21, can be, and preferably are, laminated together simultaneously with and in the same process steps as the electrical interconnection.

The individual polymeric dielectric panels 21 are laminated in an adhesive process in which plies of the polymeric dielectric 21 are heated under compression to effect surface Joining. The process may be carried with an adhesive hetero-layer between the panels 21, as a layer of a polyimide adhesive, or by thermal and compressive flow of the polymeric dielectric substrate material, or by a combination of both. Adhesive bonding is carried out by a temperature and pressure sequence in which the adhesive, or the polymeric dielectric, is heated above its glass transition temperature, and optionally above its melting temperature, under pressure, to form a bond between the plies 21.

Electrical interconnection is accomplished by metallurgically bonding pairs of pads on facing surfaces of the subassemblies. While pad to pad metallurgical solder bonding is feasible with a small number of layers and with low circuit density, bridging between adjacent solder bonded pad pairs becomes a serious limitation at high circuit densities and when there are a large number of layers to be laminated. Each subsequent lamination causes previously formed solder bonds to melt and reflow, causing shorting between adjacent lands.

According to a preferred embodiment of the present invention, transient liquid phase bonding is utilized for electrical interconnection of the subassemblies. Transient liquid phase bonding is described in, for example, commonly assigned U.S. Pat. No. 5,038,996 of James R. Wilcox and Charles G. Woychik for *BONDING OF METALLIC SURFACES,* and commonly assigned U.S. patent application Ser. No. 07/536,145, filed Jun. 11, 1990 now U.S. Pat. No. 5,280,414, issued Jan. 18, 1994, of Charles R. Davis, Richard Hsiao, James R. Loomis, Jae M. Park, and Jonathan D. Reid for *AU-SN TRANSIENT LIQUID BONDING IN HIGH PERFORMANCE LAMINATES,* the disclosures of both of which are hereby incorporated herein by reference.

Transient liquid phase bonding is a diffusion bonding technique which involves depositing non-eutectic stoichiometries of metals which are capable of forming a eutectic on facing pads. The pads, which are formed of an electrically conductive metal, as Cu, Ag, or Au, are coated with the stoichiometrically non-eutectic composition of eutectic forming metals, brought into physical contact with one another, and heated above the eutectic temperature. This initially forms a melt of eutectic+solid. However, this melt quickly solidifies because higher melting metals and intermetallics from the high melting phase diffuse into the melt. Solidification of this liquid forms a metallurgical bond between the facing pads. Transient liquid phase bonding is accomplished with a small amount of bonding material per joint, and without flux.

In the practice of our invention the eutectic temperature associated with the system is below the melting temperature of the adhesive and/or the dielectric polymer used in bonding, while the melting point of the resulting actual metallic composition formed is above the melting point of the adhesive and/or the dielectric polymer used in bonding.

According to a preferred method of our invention a gold-tin alloy on the gold-rich side of the gold-tin eutectic is used as the bonding alloy. In a preferred exemplification of the invention the Au-Sn alloy has an atomic ratio of Au/[Au+Sn] of at least about 0.6, and preferably about 0.8 to 0.9, corresponding to the intermetallic solid $AuSn+AuSn_2$.

At the low heating rates characteristic of the lamination process, the gold-tin alloy initially forms a eutectic melt at a low temperature, e.g., the Au-Sn eutectic of 280 degrees C. However, as additional gold diffuses into the melt, the melting point increases. Ultimately, with increasing time at the polymer adhesion temperature during lamination of subsequent layers, further diffusion of gold into the melt occurs and a non-eutectic gold-tin alloy is formed having a higher melting point than any temperatures attained in subsequent processing. This avoids bridging as well as avoiding the formation of brittle intermetallics.

The melting temperature of the adhesive and/or the melting temperature of the dielectric polymer is above the eutectic temperature of the Au-Sn system, but below the melting temperature of the Au-Sn alloy formed. As a result the metallurgical bond will not melt or flow during subsequent processing.

It should be noted that the Au-Sn phase diagram is an equilibrium phase diagram, and that phase transfer kinetics may actually determine the phases and phase compositions formed in transient liquid phase bonding.

While transient liquid phase bonding has been described with respect to Au-Sn alloys, it is, of course, to be understood that other metallurgies can be utilized, as Sn-Bi.

In an alternative exemplification, where an adhesive heterolayer is present between the individual polymeric dielectric plies, the eutectic temperature is below the melting temperature or thermosetting temperature of the adhesive, and the melting temperature of the joining metallurgy composition is above melting temperature of the adhesive. In a preferred exemplification the melting temperature of the joining metallurgy composition is above the melting temperature of the adhesive.

While the invention has been described with respect to certain preferred embodiments and exemplifications, it is not intended to limit the scope of the invention, but solely by the claims appended hereto.

We claim:

1. A sequentially built-up multilayer laminate of a plurality of stacked circuitized, adhesive bonded, polymeric dielectric panels with pad to pad electrical connection therebetween, wherein the pad to pad electrical connection is provided by a transient liquid phase formed metallurgical bond of a metallurgy characterized by a non-eutectic stoichiometry composition of a eutectic forming system, and prepared by (a) depositing non-eutectic stoichiometries of metals which are capable of forming eutectics with each other on facing pads, (b) bringing the deposits into contact with each other and heating the deposits above the eutectic temperature thereof to form a quickly solidifying melt of eutectic+solid metal, and (c)solidifying the melt to form the metallurgical bond between the facing pads; the eutectic temperature being below the melting temperature of the adhesive used in bonding the polymeric dielectric panels, and the melting temperature of the metallurgy being above the melting temperature of the adhesive used in bonding the polymeric dielectric panels.

* * * * *